United States Patent
Miyazaki (10) Patent No.: US 10,771,095 B2
(45) Date of Patent: Sep. 8, 2020

(54) DATA PROCESSING DEVICE, DATA PROCESSING METHOD, AND COMPUTER READABLE MEDIUM

(71) Applicant: MITSUBISHI ELECTRIC CORPORATION, Tokyo (JP)

(72) Inventor: Kiyohito Miyazaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 6 days.

(21) Appl. No.: 16/093,949

(22) PCT Filed: Jun. 7, 2016

(86) PCT No.: PCT/JP2016/066927
§ 371 (c)(1),
(2) Date: Oct. 15, 2018

(87) PCT Pub. No.: WO2017/212547
PCT Pub. Date: Dec. 14, 2017

(65) Prior Publication Data
US 2019/0109605 A1   Apr. 11, 2019

(51) Int. Cl.
*H03M 13/00* (2006.01)
*H03M 13/09* (2006.01)
(Continued)

(52) U.S. Cl.
CPC ....... *H03M 13/6502* (2013.01); *H03M 13/09* (2013.01); *H03M 13/2906* (2013.01); *H04L 1/00* (2013.01)

(58) Field of Classification Search
CPC ............. H03M 13/6502; H03M 13/09; H03M 13/2906; H04L 1/00
See application file for complete search history.

(56) References Cited

U.S. PATENT DOCUMENTS

| 5,778,013 A | 7/1998 | Jedwab |
| 2004/0187064 A1 | 9/2004 | Takahashi et al. |
| 2005/0097432 A1* | 5/2005 | Obuchi ............... H03M 13/091 714/800 |

(Continued)

FOREIGN PATENT DOCUMENTS

| JP | 6-311049 A | 11/1994 |
| JP | 7-15354 A | 1/1995 |

(Continued)

OTHER PUBLICATIONS

International Search Report for PCT/JP2016/066927 (PCT/ISA/210) dated Jul. 19, 2016.

(Continued)

*Primary Examiner* — Thien Nguyen
(74) *Attorney, Agent, or Firm* — Birch, Stewart, Kolasch & Birch, LLP (57) ABSTRACT

A region specifying unit specifies a first region where a regular bit string is in a transmission frame, a second region which has a bit string similar to a defined bit string, and a third region which has a non-regular bit string and extracts a difference between the bit string in the second region and the defined bit string. A first CRC acquisition unit acquires a first CRC corresponding to the regular bit string. A second CRC acquisition unit acquires a second CRC corresponding to the defined bit string. A differential CRC acquisition unit acquires a differential CRC corresponding to the extracted difference. A third CRC generation unit generates a third CRC corresponding to a bit string in the third region. A frame CRC generation unit generates a CRC of the transmission frame using the first CRC, the second CRC, the differential CRC, and the third CRC.

5 Claims, 6 Drawing Sheets (51) Int. Cl.
*H04L 1/00* (2006.01)
*H03M 13/29* (2006.01)

(56) References Cited

U.S. PATENT DOCUMENTS

| | | | |
|---|---|---|---|
| 2009/0319878 A1 | 12/2009 | Kaburaki | |
| 2012/0278690 A1* | 11/2012 | Wang | H03M 13/091 714/807 |
| 2014/0026021 A1* | 1/2014 | Hill | G06F 11/1004 714/807 |
| 2014/0082451 A1* | 3/2014 | Radhakrishnan | G06F 11/1076 714/758 |
| 2016/0378580 A1* | 12/2016 | Ries | G06F 11/07 714/819 |
| 2017/0075754 A1* | 3/2017 | Wang | G06F 11/1004 |
| 2018/0143872 A1* | 5/2018 | Sun | H03M 13/091 |

FOREIGN PATENT DOCUMENTS

| | | |
|---|---|---|
| JP | 8-149017 A | 6/1996 |
| JP | 2000-181807 A | 6/2000 |
| JP | 3257298 B2 | 2/2002 |
| JP | 2004-235763 A | 8/2004 |
| JP | 2006-185090 A | 7/2006 |
| JP | 4896931 B2 | 3/2012 |
| JP | 2012-169926 A | 9/2012 |
| JP | 2012-238952 A | 12/2012 |

OTHER PUBLICATIONS

K. A. Witzke et al., "A Comparison of Some Error Detecting CRC Code Standards", IEEE Transactions on Communications, Sep. 1985, vol. COM-33, No. 9, pp. 996-998.

* cited by examiner

DATA PROCESSING DEVICE, DATA PROCESSING METHOD, AND COMPUTER READABLE MEDIUM

TECHNICAL FIELD

The present invention relates to a data processing device, data processing method, and data processing program.

BACKGROUND ART

A method of generating a CRC (Cyclic Redundancy Check) by simple computation is disclosed in Patent Literature 1. In the following, the principle of CRC calculation in Patent Literature 1 is described.

Compared to first data, second data as a transmission target is different only in the value of a specific bit. The CRC of the first data has been calculated.

In Patent Literature 1, a CRC of third data in which only the bit corresponding to the specific bit has a value of 1 and all other bits have a value of 0 is obtained in advance, and the CRC of the third data is retained in a table. Then, in Patent Literature 1, exclusive OR operation is performed on the CRC of the first data and the CRC of the third data, thereby obtaining a CRC of the second data.

CITATION LIST

Patent Literature

Patent Literature 1: JP 4896931

SUMMARY OF INVENTION

Technical Problem

In a field, such as functional safety communication, where reliability is demanded, process incompletion within a defined time leads to a failure, and therefore the worst-case execution time has to be considered for the CRC computation time. Therefore, if the CRC computation time is desired to be shortened in this field, it is essential to shorten the worst-case execution time.

In the method of Patent Literature 1, if a difference between the first data and the second data is small, the CRC computation time can be shortened. However, if the difference between the first data and the second data is not small, the CRC computation time cannot be shortened. Specifically, when the difference between the first data and the second data is obtained for each bit so as to obtain a CRC of the second data, the size of the table retaining CRCs is relatively small, but the number of times of table reference is increased. Therefore, the CRC computation time is increased.

Also, as an alternative method, it can be thought that all CRCs corresponding to differences between the first data and the second data are retained in a table. In this case, the number of times of table reference is small, but the size of the table is enormous, and many storage regions are required to store the table.

A main object of the present invention is to shorten CRC computation time while reducing the size of the table.

Solution to Problem

A data processing device according to the present invention includes:

a region specifying unit to specify a first region where a regular bit string appears in a transmission frame, a second region where a bit string similar to a defined bit string appears in the transmission frame, and a third region where a non-regular bit string appears in the transmission frame and extract a difference between a bit string in the second region and the defined bit string;

a first CRC acquisition unit to acquire a first CRC, which is a CRC (Cyclic Redundancy Check) corresponding to the regular bit string, from a CRC table having a plurality of CRCs stored therein, for the first region;

a second CRC acquisition unit to acquire a second CRC, which is a CRC corresponding to the defined bit string, from the CRC table, for the second region;

a differential CRC acquisition unit to acquire a differential CRC, which is a CRC corresponding to the difference extracted by the region specifying unit, from the CRC table;

a third CRC generation unit to generate a third CRC, which is a CRC corresponding to a bit string in the third region; and a frame CRC generation unit to generate a CRC of the transmission frame by using the first CRC, the second CRC, the differential CRC, and the third CRC.

Advantageous Effects of Invention

According to the present invention, it is required to retain, in the table, only the first CRC corresponding to the regular bit string, the second CRC corresponding to the defined bit string, and the differential CRC corresponding to the difference between the defined bit string and the bit string in the second region. Also, the first CRC, the second CRC, and the differential CRC are acquired from the table and, based on the acquired first CRC, second CRC, and differential CRC and the third CRC, a CRC of the transmission frame can be generated. In this manner, according to the present invention, it is possible to shorten the CRC computation time while reducing the size of the table.

DESCRIPTION OF EMBODIMENTS

In the following, an embodiment of the present invention is described by using the drawings. In the following description of the embodiment and the drawings, those provided with a same reference character indicate a same portion or corresponding portion.

Embodiment 1

In the present embodiment, a control device 10 capable of shortening CRC computation time while reducing the size of a table is described.

Figure 1:
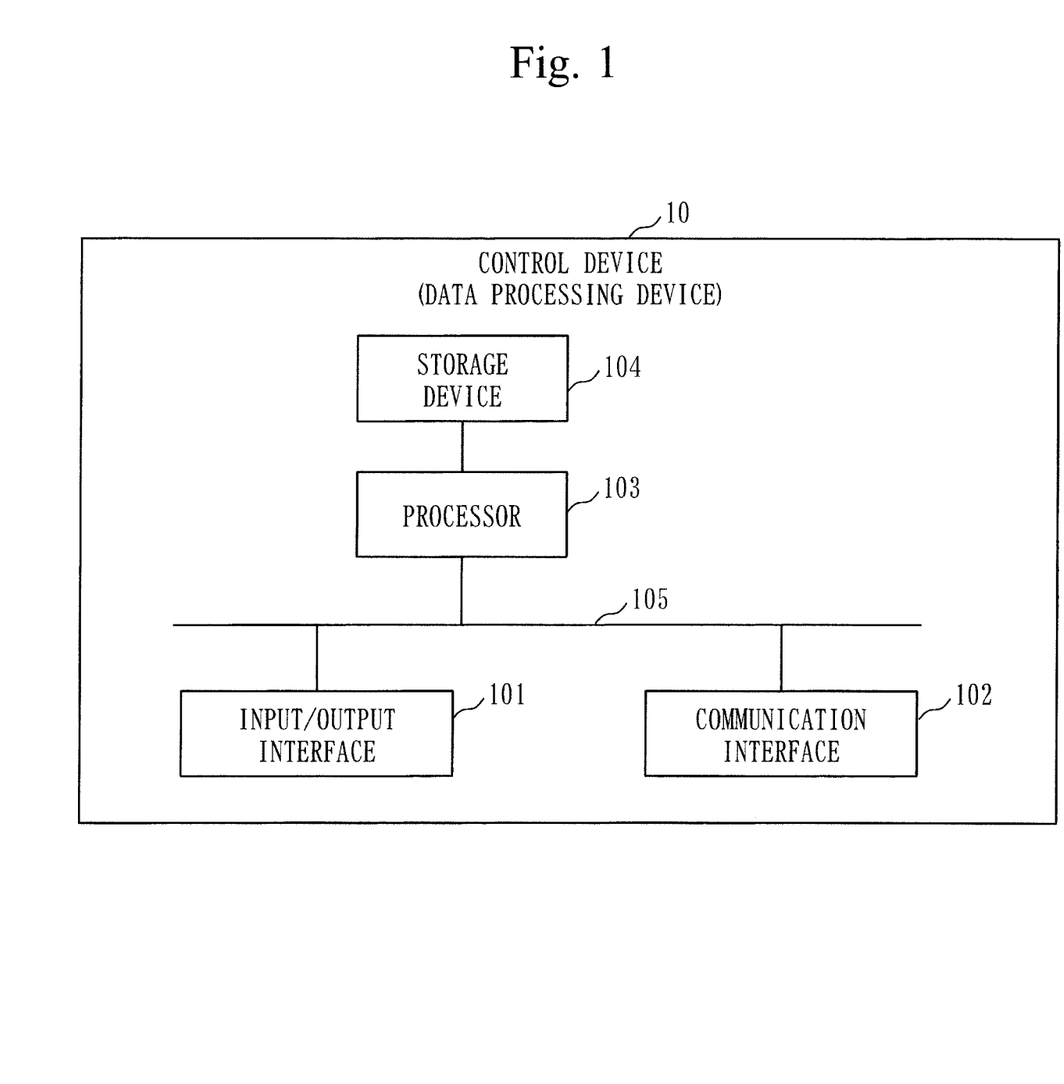
FIG. 1 illustrates a hardware structure example of a control device according to Embodiment 1.
Figure 2:
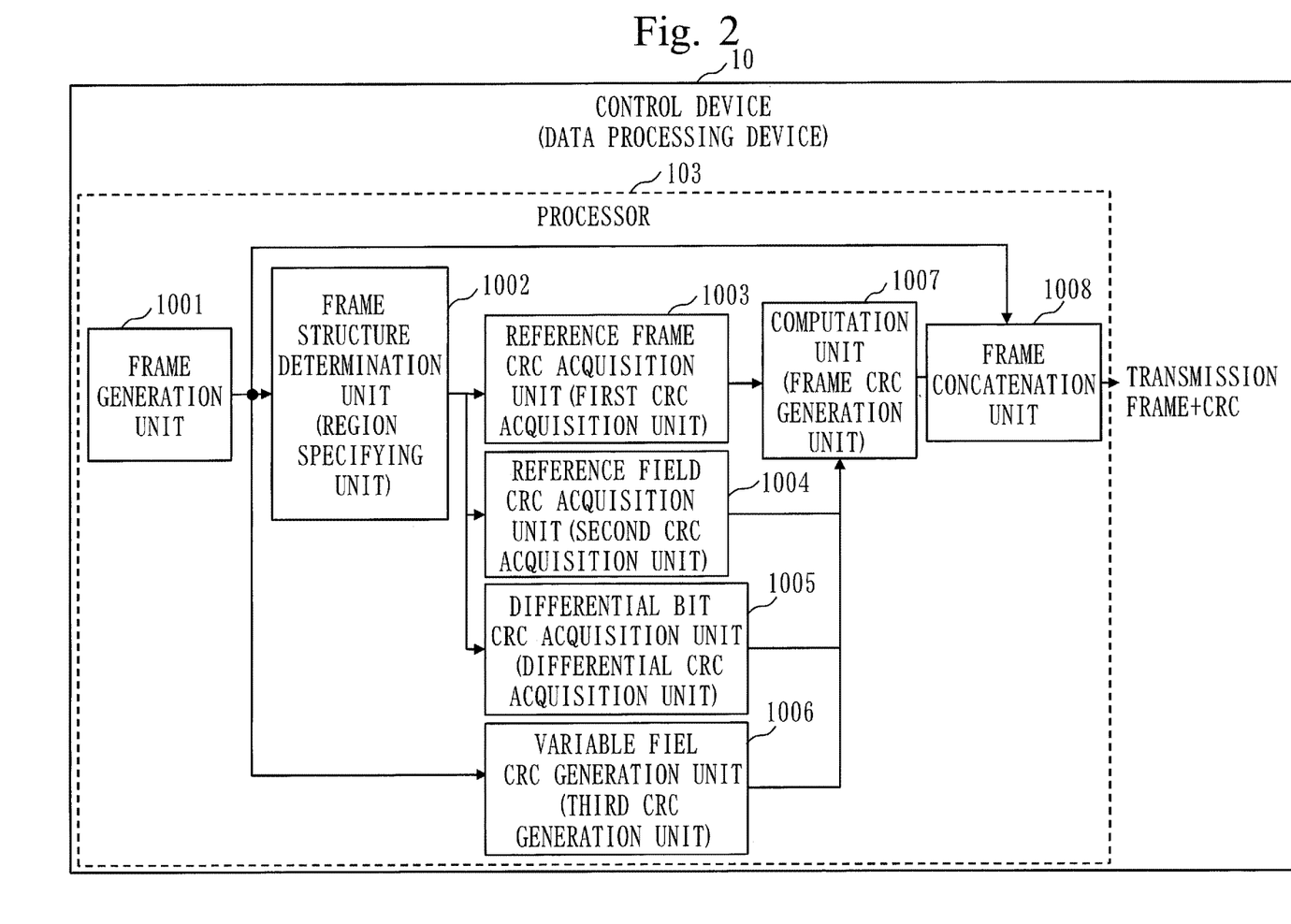
FIG. 2 illustrates a functional structure example of the control device according to Embodiment 1.

The control device 10 according to the present embodiment has a hardware structure illustrated in FIG. 1, and also has a functional structure illustrated in FIG. 2. FIG. 1 and FIG. 2 are described in detail further below.

By following a communication protocol targeted for a transmission frame to be transmitted, the control device 10 according to the present embodiment logically divides the transmission frame into a plurality of regions, and obtains a CRC for each region. The control device 10 acquires the CRC of each region, excluding a part of the regions, from a CRC table. In the CRC table, a plurality of CRCs are stored. The control device 10 then performs exclusive OR operation on the acquired CRC of each region, and generates a CRC of the transmission frame.

The control device 10 divides the regions of the transmission frame as follows:

(1) a first region where a regular bit string appears;
(2) a second region where a bit string similar to a defined bit string appears; and
(3) a third region where a non-regular bit string appears.

For each communication protocol, a region where a regular bit string, which is a fixed bit string, appears, a region where a semi-fixed bit string appears, and a region where a random non-regular bit string appears are defined.

The control device 10 according to the present embodiment specifies the first region where the regular bit string appears, the second region where a bit string (semi-fixed bit string) similar to the defined bit string appears, and the third region where the non-regular bit string appears, in the transmission frame, based on the communication protocol to which the transmission frame conforms.

While the bit string appearing in the second region preferably matches, for example, 70% of the defined bit string or higher, any degree of a ratio of matching with the defined bit string required for the second region can be determined. That is, any degree of "similarity" of the bit string in the second region to the defined bit string can be determined.

In the CRC table, a CRC corresponding to the regular bit string and a CRC corresponding to the defined bit string are stored in advance for each communication protocol. A CRC corresponding to a bit string in the third region is not stored in the CRC table.

There is a possibility that the bit string in the second region of the transmission frame does not match the defined bit string. Therefore, the control device 10 extracts a difference between the bit string in the second region of the transmission frame and the defined bit string. A corresponding CRC is stored in the CRC table in advance for each bit position of the difference.

The control device 10 acquires a CRC (equivalent to a differential CRC) corresponding to a difference between a CRC (equivalent to the first CRC) corresponding to the regular bit string and a CRC (equivalent to the second CRC) corresponding to the defined bit string, from the CRC table. Also, the control device 10 calculates a CRC (equivalent to the third CRC) corresponding to a bit string in the third region.

The control device 10 then performs exclusive OR operation on these CRCs, and generates a CRC of the transmission frame.

The conventional schemes have a problem in which the number of required patterns in the table is enormous in order to shorten the worst-case execution time. In the present embodiment, all patterns of data are represented by combinations of hierarchically-organized table entries, thereby allowing the worst-case execution time to be shortened while reducing an increase of the table size.

*Description of Structure*

FIG. 1 illustrates a hardware structure example of the control device 10 according to the present embodiment. Also, FIG. 2 illustrates a functional structure example of the control device 10. The control device 10 is equivalent to a data processing device. Also, the operation to be performed by the control device 10 is equivalent to a data processing method.

As illustrated in FIG. 1, the control device 10 is a computer with an input/output interface 101, a communication interface 102, a processor 103, and a storage device 104 connected to a bus 105.

The input/output interface 101 is used for signal inputs and outputs. Specifically, the input/output interface 101 is used for signal inputs from a sensor, a switch, and so forth connected to the control device 10. Also, the input/output interface 101 is used for signal outputs to an actuator, a lamp, and so forth connected to the control device 10.

The communication interface 102 performs communication for exchanging control data with another control device. Specifically, as control data, the communication interface 102 transmits a transmission frame added with a CRC.

The processor 103 executes a program. Specifically, the processor 103 executes a program for achieving functions of a frame generation unit 1001, a frame structure determination unit 1002, a reference frame CRC acquisition unit 1003, a reference field CRC acquisition unit 1004, a differential bit CRC acquisition unit 1005, a variable field CRC generation unit 1006, a computation unit 1007, and a frame concatenation unit 1008 illustrated in FIG. 2. The program is equivalent to a data processing program, the program for achieving the functions of the frame generation unit 1001, the frame structure determination unit 1002, the reference frame CRC acquisition unit 1003, the reference field CRC acquisition unit 1004, the differential bit CRC acquisition unit 1005, the variable field CRC generation unit 1006, the computation unit 1007, and the frame concatenation unit 1008.

The storage device 104 stores the above-described program to be executed by the processor 103. Also, the storage device 104 stores the CRC table.

To enhance availability of the control device 10, the processor 103 and the storage device 104 may be redundantly provided.

In FIG. 2, the frame generation unit 1001 generates a header and a payload of the transmission frame to be transmitted, in conformance with the specifications of the communication protocol. As described above, the communication protocol to which the transmission frame conforms defines the structure of the transmission frame. Therefore, the frame generation unit 1001 outputs information about the transmission frame and the communication protocol to the frame structure determination unit 1002.

The frame structure determination unit 1002 specifies a first region, a second region, and a third region for the transmission frame generated by the frame generation unit 1001, based on the information about the communication protocol outputted from the frame generation unit 1001. Also, the frame structure determination unit 1002 extracts a difference between a bit string in the second region and the defined bit string. The frame structure determination unit 1002 is equivalent to a region specifying unit. Also, the process to be performed by the frame structure determination unit 1002 is equivalent to a region specifying process.

The reference frame CRC acquisition unit 1003 acquires a CRC for the first region from the CRC table.

The reference frame CRC acquisition unit 1003 is equivalent to a first CRC acquisition unit. Also, the process to be performed by the reference frame CRC acquisition unit 1003 is equivalent to a first CRC acquisition process.

The reference field CRC acquisition unit 1004 acquires a CRC for the second region from the CRC table.

The reference field CRC acquisition unit 1004 is equivalent to a second CRC acquisition unit. Also, the process to be performed by the reference field CRC acquisition unit 1004 is equivalent to a second CRC acquisition process.

The differential bit CRC acquisition unit 1005 acquires a CRC for the differential bit from the CRC table.

The differential bit CRC acquisition unit 1005 is equivalent to a differential CRC acquisition unit. Also, the process to be performed by the differential bit CRC acquisition unit 1005 is equivalent to a differential CRC acquisition process.

The variable field CRC generation unit 1006 generates a CRC in the third region. The variable field CRC generation unit 1006 applies an existing scheme capable of supporting any field value by sequential exclusive OR operation from a high-order bit.

The variable field CRC generation unit 1006 is equivalent to a third CRC generation unit. Also, the process to be performed by the variable field CRC generation unit 1006 is equivalent to a third CRC generation process.

The computation unit 1007 performs exclusive OR on all CRCs, and generates a CRC of the transmission frame.

The computation unit 1007 is equivalent to a frame CRC generation unit. Also, the process to be performed by the computation unit 1007 is a frame CRC generation process.

The frame concatenation unit 1008 connects the CRC generated by the computation unit 1007 to the tail end of the transmission frame generated by the frame generation unit 1001. As a result, the transmission frame added with the CRC is outputted.

*Description of Operation* In the following, a flow of CRC generation in the control device 10 according to the present embodiment is described with reference to FIG. 3 and FIG. 4.

Figure 3:
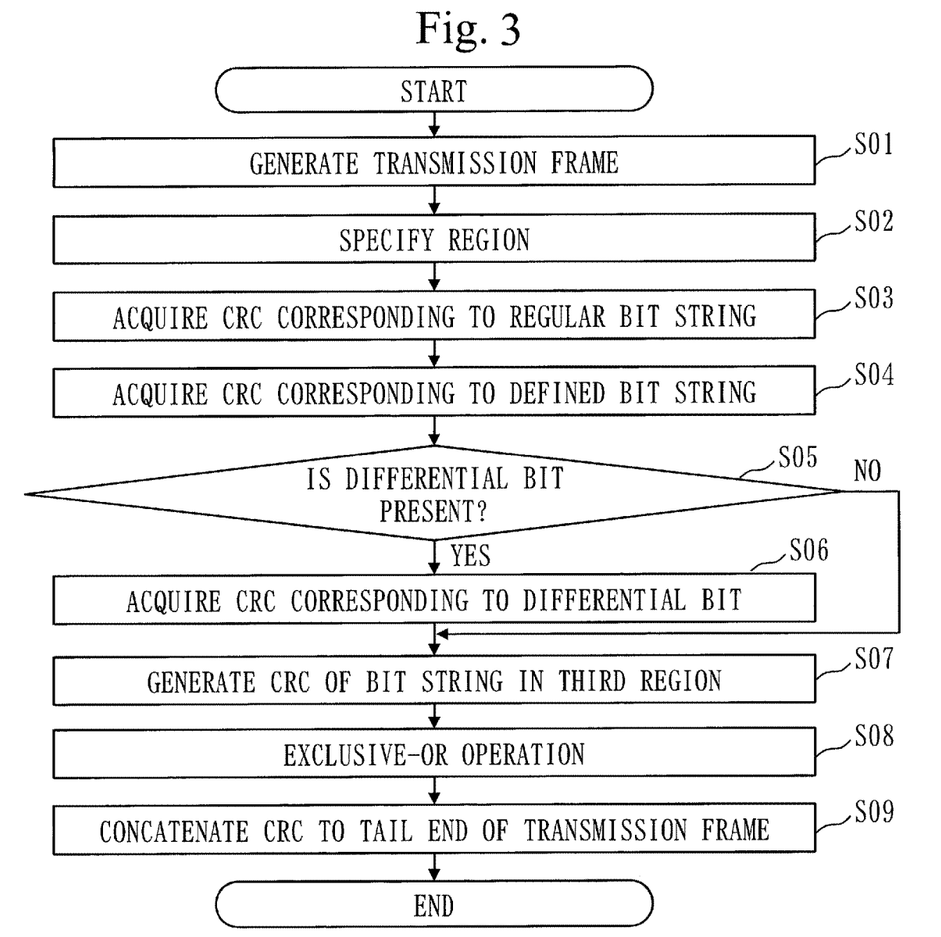
FIG. 3 is a flowchart illustrating an operation example of the control device according to Embodiment 1.

FIG. 3 is a flowchart illustrating an operation example of the control device 10. FIG. 4 illustrates a relation between frames and CRCs. A process of generating a CRC 210 to be added to a transmission frame 201 is illustrated in FIG. 4.

At step S01, the frame generation unit 1001 generates the transmission frame 201. It is assumed herein that the frame generation unit 1001 generates the transmission frame 201 of FIG. 4 based on a communication protocol a.

Figure 4:
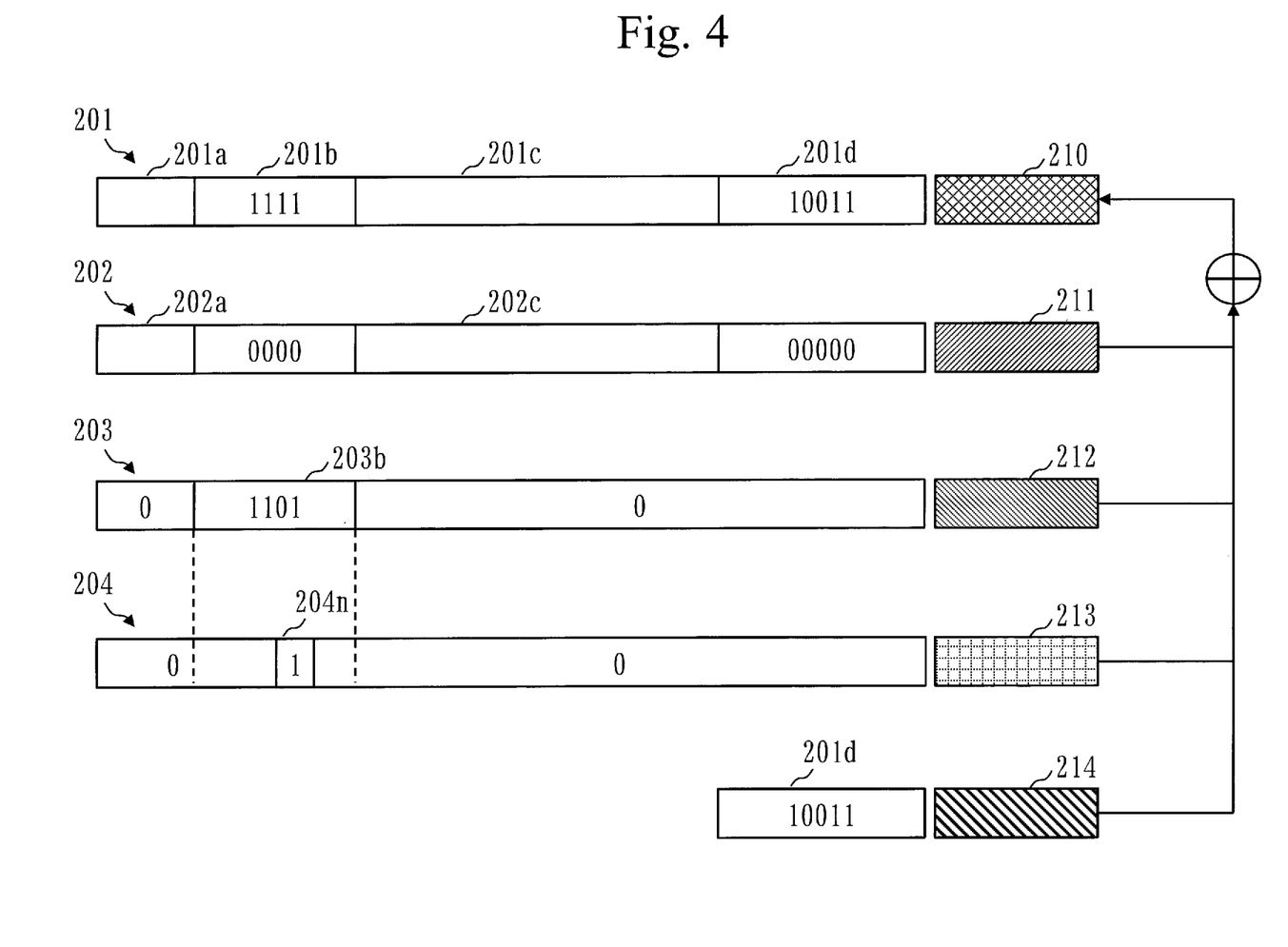
FIG. 4 illustrates a relation between frames and CRCs according to Embodiment 1.

In the transmission frame 201 of FIG. 4, a region 201a and a region 201c are equivalent to the first region, a region 201b is equivalent to the second region, and a region 201d is equivalent to the third region. That is, in the region 201a and the region 201c, a regular bit string is included. In the region 201b, a bit string similar to the defined bit is included. In the region 201d, a non-regular bit string is included.

The frame generation unit 1001 outputs information for notification of the transmission frame 201 and the communication protocol a to the frame structure determination unit 1002.

Next, at step S02, the frame structure determination unit 1002 specifies the first region, the second region, and the third region of the transmission frame 201 based on the communication protocol a to which the transmission frame 201 conforms. As a result, the frame structure determination unit 1002 specifies the region 201a and the region 201c as the first region, specifies the region 201b as the second region, and specifies the region 201d as the third region. Also, the frame structure determination unit 1002 finds a differential bit between the bit string included in the region 201b and the defined bit string.

Also, the frame structure determination unit 1002 notifies the reference frame CRC acquisition unit 1003 of the identifier of a CRC corresponding to the regular bit string of the communication protocol a for the first regions 201a and 201c.

Also, the frame structure determination unit 1002 notifies the reference field CRC acquisition unit 1004 of the identifier of a CRC corresponding to the defined bit string of the communication protocol a for the second region 201b.

Also, the frame structure determination unit 1002 outputs the bit string included in the third region 201d to the variable field CRC generation unit 1006.

Also, the frame structure determination unit 1002 notifies the differential bit CRC acquisition unit 1005 of the identifier of a CRC corresponding to the differential bit.

At step S03, based on the identifier notified by the frame structure determination unit 1002, the reference frame CRC acquisition unit 1003 acquires, from the CRC table, a CRC corresponding to the regular bit string of the communication protocol a for the first regions 201a and 201c.

More specifically, the reference frame CRC acquisition unit 1003 acquires, from the CRC table, a CRC 211 of a reference frame 202 illustrated in FIG. 4. The reference frame 202 is a frame having the same frame length as the transmission frame 201. In the reference frame 202, a region 202a corresponding to the region 201a of the transmission frame 201 is configured of the same regular bit string as the region 201a, and a region 202c corresponding to the region 201c of the transmission frame 201 is configured of the same regular bit string as the region 201c. Meanwhile, regions other than the region 202a and the region 202c have a bit value of 0.

At step S04, based on the identifier notified by the frame structure determination unit 1002, the reference field CRC acquisition unit 1004 acquires, from the CRC table, a CRC corresponding to the defined bit string of the communication protocol a for the second region 201b.

More specifically, the reference field CRC acquisition unit 1004 acquires, from the CRC table, a CRC 212 of a frame 203 illustrated in FIG. 4. The frame 203 is a frame having the same frame length as the transmission frame 201. In the frame 203, a region 203b corresponding to the region 201b of the transmission frame 201 is configured of the defined bit string. Meanwhile, regions other than the region 203b have a bit value of 0. The region 203b having the defined bit string stored therein is also referred to as a reference field.

If a differential bit is present at step S05, that is, if the identifier of the CRC corresponding to the differential bit has been notified by the frame structure determination unit 1002, at step S06, the differential bit CRC acquisition unit 1005 acquires, from the CRC table, the CRC corresponding to the differential bit, based on the identifier notified by the frame structure determination unit 1002.

More specifically, the differential bit CRC acquisition unit 1005 acquires, from the CRC table, a CRC 213 of a frame 204 illustrated in FIG. 4. The frame 204 is a frame having the same frame length as the transmission frame 201. In the frame 204, the bit value at a position 204n corresponding to the differential bit between the bit string in the region 201b and the defined bit string in the region 203b is 1. Meanwhile, the bit values in regions other than the position 204n are 0.

At step S07, the variable field CRC generation unit 1006 generates a CRC 214 for the bit string in the third region 201*d* outputted from the frame structure determination unit 1002. The third region 201*d* is also referred to as a variable field.

At step S08, the computation unit 1007 performs exclusive OR operation on the CRC 211, the CRC 212, the CRC 213, and the CRC 214, and generates the CRC 210 of the transmission frame 201.

Finally, at step S09, the frame concatenation unit 1008 concatenates the CRC 210 to the tail end of the transmission frame 201.

While FIG. 3 illustrates an example in which the process is performed in the order of step S03, step S04, step S05, step S06, and step S07, these step S03, step S04, step S05, step S06, and step S07 may be concurrently performed.

*Others* According to the present embodiment, it is required to ensure that transmission frames of all patterns can be configured by combinations of a reference frame, a reference field, a differential bit, and a variable field and can be generated with the number of times of table reference equal to or smaller than a defined value.

In the following, a transmission frame configuring method and a reference field and differential bit configuring method for reducing the number of times of table reference to the defined value or smaller are described.

1. Transmission Frame Configuring Method

Depending on the communication protocol, transmission frames of a plurality of types with significantly varying regions where the regular bit string appears may be transmitted, due to the communication type such as fixed-cycle communication or non-fixed-cycle communication. In this case, it is required to prepare a different reference frame for each type of transmission frame.

As described above, a field where a bit string appears and it is difficult to predict the bit string which appears is treated as a variable field. For example, the variable field is a payload of a transmission frame.

A field acquired by excluding a field where the regular bit string appears and the variable field in the reference frame from the transmission frame is a reference field. At least one or more reference fields are present in the transmission frame. That is, a plurality of reference fields may be present in the transmission frame. The plurality of reference fields divided in the transmission frame may be handled as separate reference fields, or the plurality of reference fields may be handled as one reference field.

2. Reference Field and Differential Bit Configuring Method

At the time of CRC generation, CRCs have to be obtained as many as a maximum value of a Hamming distance between the defined bit string in the reference field 203*b* of the frame 203 and the bit string in the reference field 201*b* of the transmission frame 201 of FIG. 4, that is, the number of differential bits. Here, computation by referring to the table as many times as the number of differential bits is required. Thus, the number of differential bits has an influence on the CRC computation time.

Meanwhile, to reduce the number of times of table reference, increasing the type of defined bit string in the reference field 203*b* can be thought. For example, in the example of FIG. 4, if the types of defined bit strings in the reference field 203*b* are increased in addition to "1101", such as "0000", "1000", "1100", "1110", and "1111", the total number of times of differential bits can be decreased, and the number of times of table reference can be decreased. In this case, however, the number of CRCs corresponding to the reference field increases, and therefore the table size of the CRC table increases.

Figure 5:
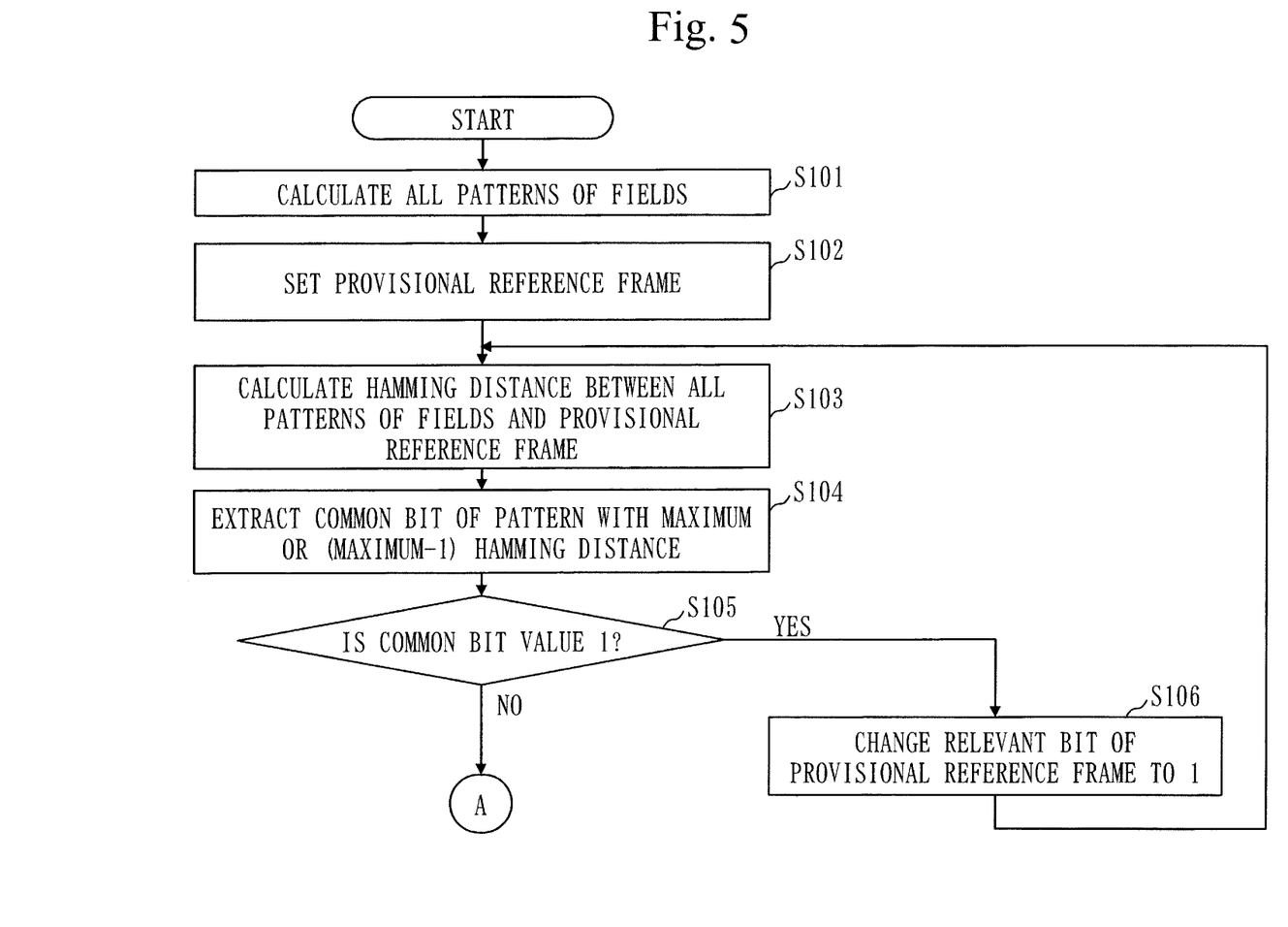
FIG. 5 is a flowchart illustrating a procedure of determining a relation between a reference field and a differential bit according to Embodiment 1.
Figure 6:
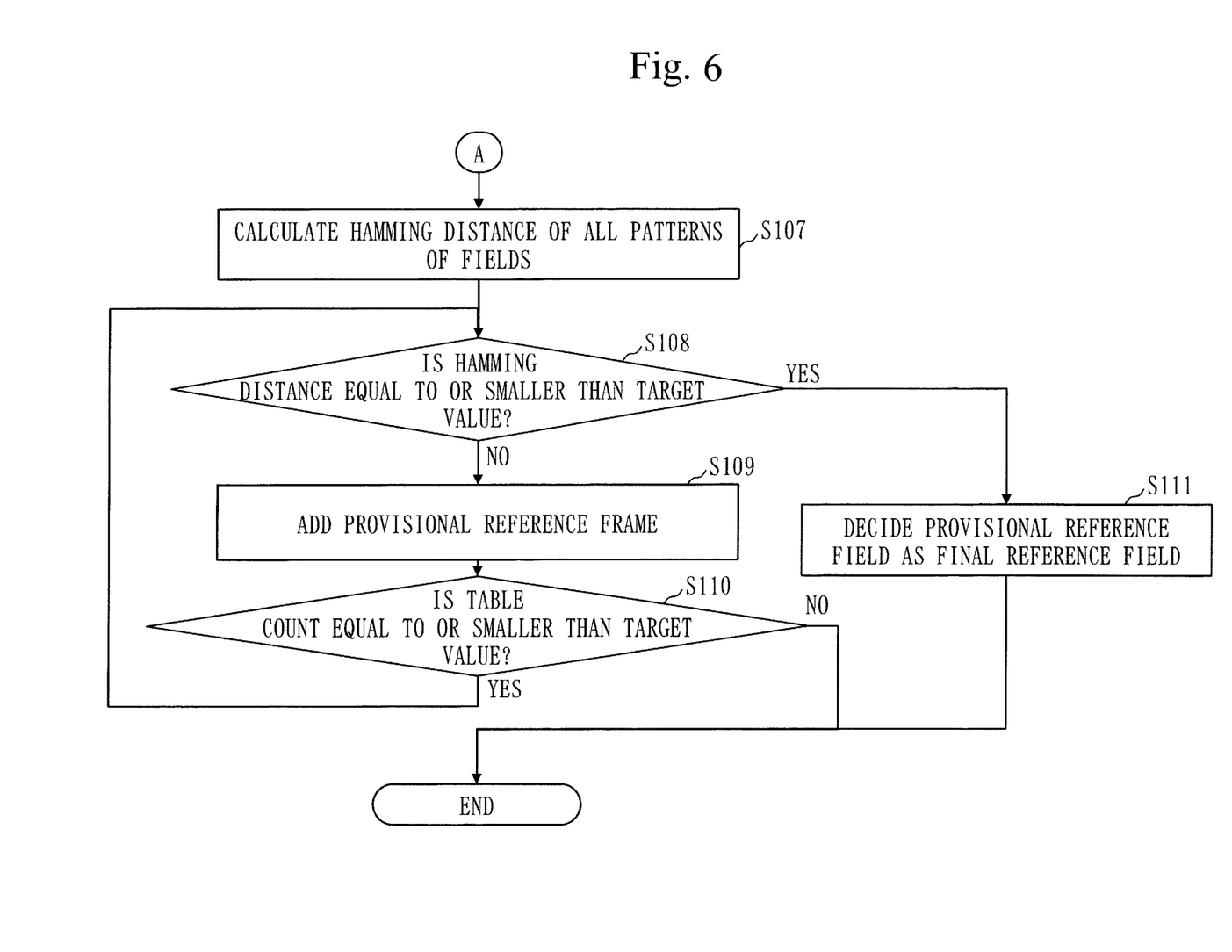
FIG. 6 is a flowchart illustrating a procedure of determining the relation between the reference field and the differential bit according to Embodiment 1.

To balance the computation time and the table size, a system administrator sets a target value for each of the number of differential bits and the table size, and finds the structure of the reference field and the differential bit satisfying both of these target values by using a method illustrated in FIG. 5 and FIG. 6.

At step S101, the system administrator finds all patterns of fields that can be transmitted.

At step S102, if a region where the bit value does not change in the field is present, the system administrator fixes the bit value for that region, and sets a frame where the bit value in the region where the bit value changes is 0 as a provisional reference frame.

At step S103, the system administrator calculates a Hamming distance for all patterns of fields with respect to the provisional reference frame. Also, the system administrator classifies all patterns of fields for each Hamming distance.

At step S104, the system administrator extracts a bit having a common value between a set of fields with a maximum Hamming distance and a set of fields with a (maximum−1) Hamming distance.

At step S105, the system administrator determines whether the value of the common bit extracted at step S104 is 1.

When the value of the common bit is 1, the system administrator performs step S106. When the value of the common bit is 0, the system administrator performs step S107.

At step S106, the system administrator sets the value of a bit of the provisional reference frame corresponding to the common bit at 1.

At step S107, the system administrator calculates a Hamming distance for all patterns of fields with respect to the provisional reference frame.

At step S108, the system administrator determines whether a maximum value of the Hamming distances calculated at step S107 is equal to or smaller than a target value.

The system administrator performs step S111 if the maximum value of the Hamming distances calculated at step S107 is equal to or smaller than a target value, and performs step S109 otherwise.

At step S109, for the set of fields with a maximum Hamming distance from the provisional reference frame, the system administrator selects a bit taking both values of 0 and 1. That is, in addition to a provisional reference frame in which the relevant bit is 0, the system administrator acquires a provisional reference frame in which the relevant bit is 1.

The system administrator records from which field the pattern of each field is calculated.

At step S110, the system administrator determines whether the table count after adding the provisional reference frame at step S109 is equal to or smaller than the target value. If the table count is equal to or smaller than the target value, the system administrator performs step S107. Otherwise, the system administrator determines that both of the targeted number of times of table reference and table size cannot be achieved, and ends the flow illustrated in FIG. 5 and FIG. 6.

At step S111, all provisional reference field calculated so far are decided as final reference fields, and the flow illustrated in FIG. 5 and FIG. 6 ends.

*Description of Effects of Embodiment*

In the present embodiment, it is only required to retain, in the CRC table, only the first CRC corresponding to the regular bit string, the second CRC corresponding to the defined bit string, and the differential CRC corresponding to the difference between the defined bit string and the bit string in the second region. Also, the first CRC, the second CRC, and the differential CRC are acquired from the CRC table and, based on the acquired first CRC, second CRC, and differential CRC and the third CRC, a CRC of the transmission frame can be generated. In this manner, according to the present embodiment, it is possible to shorten the CRC computation time while reducing the size of the table.

\*\*\*Description of Hardware Structure\*\*\*

Finally, supplemental description of the hardware structure of the control device 10 is made.

The processor 103 illustrated in FIG. 1 is an IC (Integrated Circuit) which performs processing.

The processor 103 is a CPU (Central Processing Unit), DSP (Digital Signal Processor), or the like.

The storage device 104 illustrated in FIG. 1 is a RAM (Random Access Memory), ROM (Read Only Memory), flash memory, HDD (Hard Disk Drive), or the like.

The communication interface 102 illustrated in FIG. 1 includes a receiver which receives data and a transmitter which transmits data.

The communication interface 102 is, for example, a communication chip or NIC (Network Interface Card).

The input/output interface 101 illustrated in FIG. 1 is, for example, a mouse, a keyboard, or a display.

An OS (Operating System) is also stored in the storage device 104.

And, at least part of the OS is executed by the processor 103.

While executing at least part of the OS, the processor 103 executes programs for achieving the functions of the frame generation unit 1001, the frame structure determination unit 1002, the reference frame CRC acquisition unit 1003, the reference field CRC acquisition unit 1004, the differential bit CRC acquisition unit 1005, the variable field CRC generation unit 1006, the computation unit 1007, and the frame concatenation unit 1008 (these are hereinafter collectively referred to as "units").

With the processor 103 executing the OS, task management, memory management, file management, communication control, and so forth are performed.

Also, information, data, a signal value, and a variable value indicating the results of processes by the "unit" are stored in at least any of the storage device 104 and a register and a cache memory in the processor 103.

Also, the programs for achieving the functions of the "units" may be stored in a portable storage medium such as a magnetic disk, flexible disk, optical disk, compact disk, Blu-ray (a registered trademark) disk, or DVD.

Also, the "units" may be read as "circuits", "steps", "procedures", or "processes".

Also, the control device 10 may be achieved by an electronic circuit such as a logic IC (Integrated Circuit), GA (Gate Array), ASIC (Application Specific Integrated Circuit), or FPGA (Field-Programmable Gate Array).

In this case, each of the "units" is achieved as part of the electronic circuit. Note that the processor and the above electronic circuits are also collectively referred to as processing circuitry.

REFERENCE SIGNS LIST

10: control device; 101: input/output interface; 102: communication interface; 103: processor; 104: storage device; 105: bus; 1001: frame generation unit; 1002: frame structure determination unit; 1003: reference frame CRC acquisition unit; 1004: reference field CRC acquisition unit; 1005: differential bit CRC acquisition unit; 1006: variable field CRC generation unit; 1007: computation unit; 1008: frame concatenation unit

The invention claimed is:

1. A data processing device comprising:
processing circuitry to:
specify a first region where a regular bit string is in a transmission frame, a second region where a bit string similar to a defined bit string is in the transmission frame, and a third region where a non-regular bit string is in the transmission frame and extract a difference between a bit string in the second region and the defined bit string;
acquire, from a CRC table having a plurality of stored CRCs (Cyclic Redundancy Checks), a first CRC, which is a CRC corresponding to the regular bit string for the first region;
acquire, from the CRC table, a second CRC, which is a CRC corresponding to the defined bit string which is similar to the bit string in the second region;
acquire, from the CRC table, a differential CRC, which is a CRC corresponding to a difference extracted between the bit string in the second region and the defined bit string;
generate a third CRC, which is a CRC corresponding to a bit string in the third region; and
generate a CRC of the transmission frame by performing an exclusive logical operation using the first CRC, the second CRC, the differential CRC, and the third CRC;
wherein the processing circuitry specifies, as the second region, a region of the transmission frame which has a bit string similar to any of the one or more defined bit string, the number of defined bit strings and bit patterns of the defined bit strings being decided such that a target value is set for each of a number of differences and a table size of the CRC table and each difference is equal to or smaller than its set target value and the table size is equal to or smaller than its set target value.

2. The data processing device according to claim 1, wherein
the processing circuitry acquires, as the first CRC, from the CRC table, a CRC of a frame having a frame length equal to the transmission frame, having a region corresponding to the first region configured of the regular bit string, and having a bit value of 0 in a region of the transmission frame other than the region of the transmission frame corresponding to the first region,
acquires, as the second CRC, from the CRC table, a CRC of a frame having a frame length equal to the transmission frame, having a region corresponding to the second region configured of the defined bit string which is similar to the bit string in the second region, and having a bit value of 0 in a region other than the region corresponding to the second region,
acquires, as the differential CRC, from the CRC table, a CRC of a frame having a frame length equal to the transmission frame, having a bit value of 1 at a position corresponding to the difference, and having a bit value of 0 in a region of the transmission frame other than the position corresponding to the difference, and
generates the CRC of the transmission frame by performing exclusive OR operation on the first CRC, the second CRC, and the differential CRC, and the third CRC.

3. The data processing device according to claim 1, wherein
the processing circuitry specifies the first region, the second region, and the third region based on a communication protocol to which the transmission frame conforms.

4. A data processing method comprising:
a region specifying process, by a computer, of specifying a first region where a regular bit string is in a transmission frame, a second region where a bit string similar to a defined bit string is in the transmission frame, and a third region where a non-regular bit string is in the transmission frame and extracting a difference between a bit string in the second region and the defined bit string;
a first CRC acquisition process, by the computer, of acquiring, from a CRC table having a plurality of stored CRCs (Cyclic Redundancy Checks), a first CRC, which is a CRC corresponding to the regular bit string, for the first region;
a second CRC acquisition process, by the computer, of acquiring, from the CRC table, a second CRC, which is a CRC corresponding to the defined bit string which is similar to the bit string in the second region;
a differential CRC acquisition process, by the computer, of acquiring, from the CRC, a differential CRC, which is a CRC corresponding to the difference extracted between the bit string in the second region and the defined bit string;
a third CRC generation process, by the computer, of generating a third CRC, which is a CRC corresponding to a bit string in the third region; and
a frame CRC generation process, by the computer, of generating a CRC of the transmission frame by performing an exclusive logical operation using the first CRC, the second CRC, the differential CRC, and the third CRC;
wherein in the region specifying process, the computer specifies, as the second region, a region of the transmission frame which has a bit string similar to any of the one or more defined bit strings, the number of defined bit strings and bit patterns of the defined bit strings being decided such that a target value is set for each of a number of differences and a table size of the CRC table and each difference is equal to or smaller than its set target value and the table size is equal to or smaller than its set target value.

5. A non-transitory computer readable medium storing a data processing program that causes a computer to execute:
a region specifying process of specifying a first region where a regular bit string is in a transmission frame, a second region where a bit string similar to a defined bit string is in the transmission frame, and a third region where a non-regular bit string is in the transmission frame and extracting a difference between a bit string in the second region and the defined bit string;
a first CRC acquisition process of acquiring, from a CRC table having a plurality of stored CRCs, a first CRC, which is a CRC (Cyclic Redundancy Check) corresponding to the regular bit string for the first region;
a second CRC acquisition process of acquiring, from the CRC table, a second CRC, which is a CRC corresponding to the defined bit string which is similar to the bit string in the second region;
a differential CRC acquisition process of acquiring, from the CRC table, a differential CRC, which is a CRC corresponding to the difference between the bit string in the second region and the defined bit string which is extracted by the region specifying process;
a third CRC generation process of generating a third CRC, which is a CRC corresponding to a bit string in the third region; and
a frame CRC generation process of generating a CRC of the transmission frame by performing an exclusive logical operation using the first CRC, the second CRC, the differential CRC, and the third CRC;
wherein the data processing program causes the computer, in the region specifying process, to specify, as the second region, a region of the transmission frame which has a bit string similar to any of the one or more defined bit strings, the number of defined bit strings and bit patterns of the defined bit strings being decided such that a target value is set for each of a number of differences and a table size of the CRC table and each difference is equal to or smaller than its set target value and the table size is equal to or smaller than its set target value.

* * * * *